United States Patent [19]

Dyck

[11] Patent Number: 5,796,433
[45] Date of Patent: Aug. 18, 1998

[54] MULTIPLE-FRAME CCD IMAGE SENSOR WITH OVERLYING PHOTOSENSITIVE LAYER

[75] Inventor: Rudolph H. Dyck, Palo Alto, Calif.

[73] Assignee: Loral Fairchild Corp., Milpitas, Calif.

[21] Appl. No.: 619,891

[22] Filed: Mar. 20, 1996

[51] Int. Cl.[6] .................................................... H04N 3/14
[52] U.S. Cl. ........................ 348/311; 348/315; 257/231; 257/232
[58] Field of Search ......................... 348/311, 315, 348/322, 312, 313; 257/231, 232, 242, 226, 236, 241, 249, 305, 354, 398, 399, 400, 519, 648; H04N 3/14

[56] References Cited

U.S. PATENT DOCUMENTS

| | | | |
|---|---|---|---|
| 3,995,302 | 11/1976 | Amelio | 257/232 |
| 4,063,992 | 12/1977 | Hosack | |
| 4,514,766 | 4/1985 | Koike et al. | |
| 4,598,321 | 7/1986 | Elabd et al. | |
| 4,774,557 | 9/1988 | Kosonocky | 257/222 |
| 4,821,103 | 4/1989 | Busby | |
| 4,831,453 | 5/1989 | Takemura | |
| 4,924,316 | 5/1990 | Kobayashi et al. | |
| 4,963,952 | 10/1990 | Janesick | |
| 4,989,075 | 1/1991 | Ito | |
| 4,998,153 | 3/1991 | Kuyk et al. | 348/311 |
| 5,170,236 | 12/1992 | Yamada | 257/222 |
| 5,406,331 | 4/1995 | Barrett | 348/268 |
| 5,497,195 | 3/1996 | Sayag | 348/266 |
| 5,504,526 | 4/1996 | Miyagawa et al. | 348/313 |

FOREIGN PATENT DOCUMENTS

0066767 A2  12/1982  European Pat. Off. ......... H04N 3/15

Primary Examiner—Andrew I. Faile
Assistant Examiner—Luong Nguyen
Attorney, Agent, or Firm—Perman & Green, LLP

[57] ABSTRACT

A multiple-frame image sensor comprising a full-frame CCD sensor of two-story construction having an overlying photosensitive layer that converts input radiation to electric charge and an underlying CCD structure which functions to collect and store the charge for read-out of more than one charge packet per pixel, with the pixels being of minimum size. The sensor structure is rendered capable of handling more than one photosignal charge packet per pixel in an area-efficient way through the use of ripple clocking, so that in a preferred embodiment a 4-poly, 7-phase ripple-clocked vertical CCD register is fabricated with 7 gates, one of which is run vertically to create openings, e.g., between the 1 and 6 gates, that pass electrode contacts to N+ sources in the channel stops of the register to form photosignal charge packets in the region between the stops. The ripple-gating controls the movement of the charge packets for storage along the CCD channel until 3 charge packet read-out. In this two-story embodiment, there is no mixing of signal charge from the several exposures. Other embodiments involving 3- and 2-poly designs, MPP barriers, and 5-phase ripple-clocking and 6-electrode non-ripple clocking are described.

24 Claims, 5 Drawing Sheets

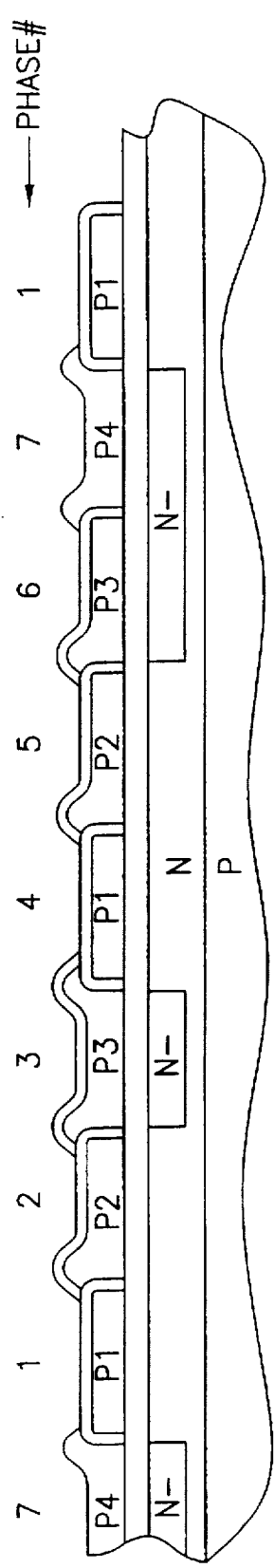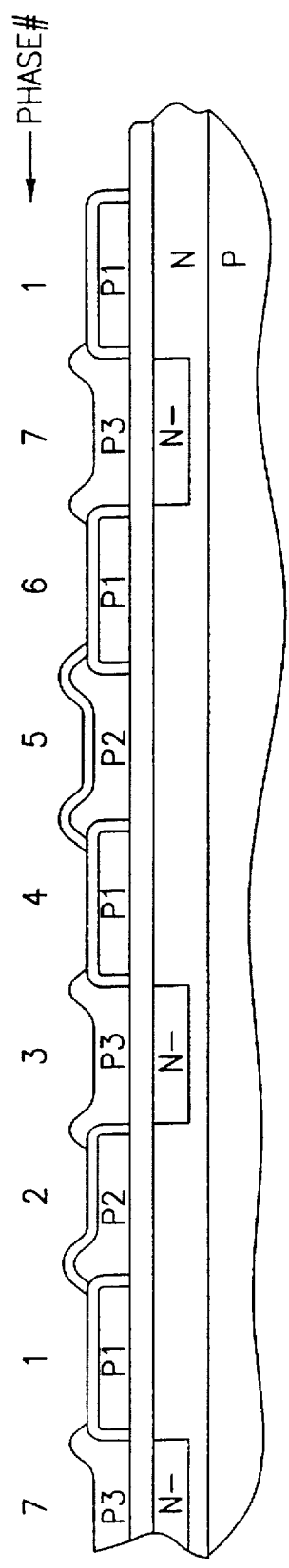
FIG.4
FIG.5

MULTIPLE-FRAME CCD IMAGE SENSOR WITH OVERLYING PHOTOSENSITIVE LAYER

RELATED APPLICATIONS

The subject matter of this application is related to that disclosed in commonly-assigned, co-pending U.S. patent application Ser. No. 07/994,875, filed 23 Dec. 1992, and a continuation-in-part-thereof Ser. No. 08/314,599, filed 28 Sep. 1994, as well as co-pending applications Ser. No. 08/533,069, filed 25 Sep. 1995, and Ser. No. 08/557,652, filed 14 Nov. 1995.

BACKGROUND OF THE INVENTION

1. Field of the Invention

The present invention relates to high resolution CCD image sensors and more particularly to a multiple-frame CCD sensor capable of collecting image photosignals from more than one exposure interval in rapid sequence for readout of all of the stored signals after completion of the last exposure.

2. Prior Art

Currently in the electronic image sensing art most electronic image sensors are either 1) reset every 1/60 to 1/30 of a second, or 2) reset, one field at a time, every 1/60 sec with two overlapping integration times. The read-out usually occurs during the image acquisition and utilizes all the frame time. In one type of electronic image sensor, the non-interlaced type, all of the detector population is reset after every exposure and then read out in the dark without light incident on the sensor. To generate a color image of a scene, typically three sensors are utilized to simultaneously image the scene in different colors and then the three image signals detected are read out in parallel, as is the case in broadcast applications.

Alternatively, a mosaic color filter can be utilized on the detectors and then chrominance and luminance signals, composed from the electronic output of the image sensor array, can be used to reproduce the image. One other known technique in this regard uses a color filter wheel and reads out one image frame at a time during three consecutive exposures. This last method requires a very long image freeze time, i.e., several seconds, to be able to read out the first color image, e.g., red, before imaging the next frame, e.g., green, and again to read out the green image before imaging the blue frame, so that it is not very practical for any motion scenes and thus for video applications.

In high speed imaging of objects in motion, such as imaging objects from moving platforms like aircraft, or imaging a scene with multiple color bands, it is necessary to rapidly integrate several exposures, e.g., every 1/100 to 1/60 sec, and then store the image frames corresponding to these exposures on a chip in preparation for read-out or further image processing. Further processing on the chip may involve, for example, time delay and integration, color processing, frame averaging, spatial filtering, etc. Thus, the available area on the chip for these various functions becomes a concern.

The sensor devices shown in U.S. Pat. Nos. 4,821,103 to BUSBY and 4,831,453 to TAKEMURA exemplify a prior art approach involving the detection and rapid storage of separate exposures of an image frame, two in this case, and then subsequently reading out the stored exposures to compose the image. In particular, TAKEMURA uses two storage registers at one end for handling the two separate exposures in a video application.

U.S. Pat. No. 4,924,316 to KOBAYASHI pertains to video color imaging wherein the color images are applied to individually color filtered light sensitive detector units and the R, G and B fields are stored separately.

While these prior art approaches have various advantages, they all are directed to video systems, do not take CCD vertical and horizontal (column and row) shift register detector devices into account, and all have the disadvantage of requiring extra chip real estate for storage.

U.S. Pat. No. 4,514,766 to KOIKE does provide an imaging system employing CCD vertical and horizontal shift registers wherein charges are transferred from the photodiodes to the vertical shift registers and the charge signals are shifted along the vertical shift registers, but no storing of the charge from multiple exposures of an image frame for subsequent read-out is suggested.

An example of another multiple-frame, rapid-sequence sensor involving some charge storage is found in U.S. Pat. No. 4,989,075 to Y. ITO wherein electrical charge packets produced by three successive color image exposures, e.g., R, G, and B, are respectively stored in and transferred by three parallel vertical CCD transfer arrays to respective horizontal transfer arrays for separate read-out by three amplifiers to combining circuitry for eventual three-color image display. The handling of the charge for the three color exposures with three separate hardware systems again is costly in chip real estate as there appears to be considerable dead space per pixel. The three vertical CCD registers, which operate in a periodic sequential mode, are 2-phase with channel stops necessarily between them which contributes to dead space. Dead space represents loss of sensitivity and also aliasing or Moire problems.

Problem to be Solved

It is therefore a problem in the art to handle multiple-frame, rapid-sequence color image sensing effectively to produce high resolution images while minimizing the complexity of the sensing device and the amount of chip real estate required.

Objects of the Invention

It is accordingly an object of the present invention to provide a high resolution image sensor device on a chip capable of collecting and storing image photosignals, in rapid sequence, from more than one exposure interval, for readout of all of the stored signals after completion of the last exposure.

It is another object of the present invention to provide a high resolution CCD image sensor device which stores several image frames, acquired from exposures that are generated in a rapid sequence, and reads out more than one charge packet per pixel, with pixels being of minimum size.

It is a further object of the invention to provide CCD image sensor devices wherein, for example, red, green, and blue color-image frames can be rapidly acquired upon the opening of a flash exposure shutter, and very rapidly transferred along storage channels from which the three frames can be read out when the shutter is closed.

SUMMARY OF THE INVENTION

The present invention is directed to the design and fabrication of a multiple-frame image sensor having an overlying photosensitive layer that converts input radiation to electrical charge and an underlying CCD structure which functions to collect and store the charge for read-out of more than one charge packet per pixel, with the pixels being of minimum size. A sensor in accordance with the invention comprises a full-frame CCD image sensor with a two-story construction having the capability of collecting photosignals from more than one exposure interval of an image, storing them separately in a compact way, and sending them all out at the end of the exposure sequence. The sensor structure is rendered capable of handling more than one photosignal charge packet per pixel in an area-efficient way through the use of ripple clocking, so that in a preferred embodiment a 4-poly, 7-phase ripple-clocked vertical CCD register is fabricated in the same manner as a 3-phase device to handle 3 charge packets, and has 7 gates performing the same function as the 9 gates in a non-ripple 3-phase device. One of the 7 poly lines is run vertically so as to create openings in the composite poly gate layout, e.g., between the 1 and 6 gates, that permit electrode contacts to be made from the upper-story electrode to the N+ sources located in recesses in the P-type channel stops (CS) between the registers to form photosignal charge packets in the region between the stops. The ripple-gating controls the movement of the charge packets for storage along the CCD channel until the 3 charge packets are formed and read-out. In this two-story embodiment, there is no mixing of signal charge from the several exposures.

The overlying photosensitive layer is, in one preferred embodiment, of amorphous silicon providing high quantum efficiency over the visible spectrum and having low dark current density. In a second preferred embodiment this layer can be photoconductive with photoconductive gain and also have a blocking contact so that high electric fields can be achieved for multiplication gain and/or avalanche gain. A variety of suitable materials and multi-layer structures can also be used for the photosensitive layer.

The invention may be applied in a 3-color sequential camera having a shutter that opens at the start of the imaging and closes at the end, and a rapidly changing set of color filters that operate during imaging. The color filters may be electro-optical, and the shuttering may be enabled by electro-optical means.

BRIEF DESCRIPTION OF THE DRAWINGS

FIG. 4 is a view in cross-section of a CCD structure in accordance with the invention showing multi-pinned phase (MPP) barriers implanted after Poly-2 definition so as to form two MPP wells per unit cell in a 4-Poly design.

FIG. 5 is a view in cross-section of a CCD structure in accordance with the invention showing MPP barriers implanted after Poly-2 definition so as to form one MPP well per unit cell in a 3-Poly design.

DETAILED DESCRIPTION OF THE PREFERRED EMBODIMENT

Figure 1:
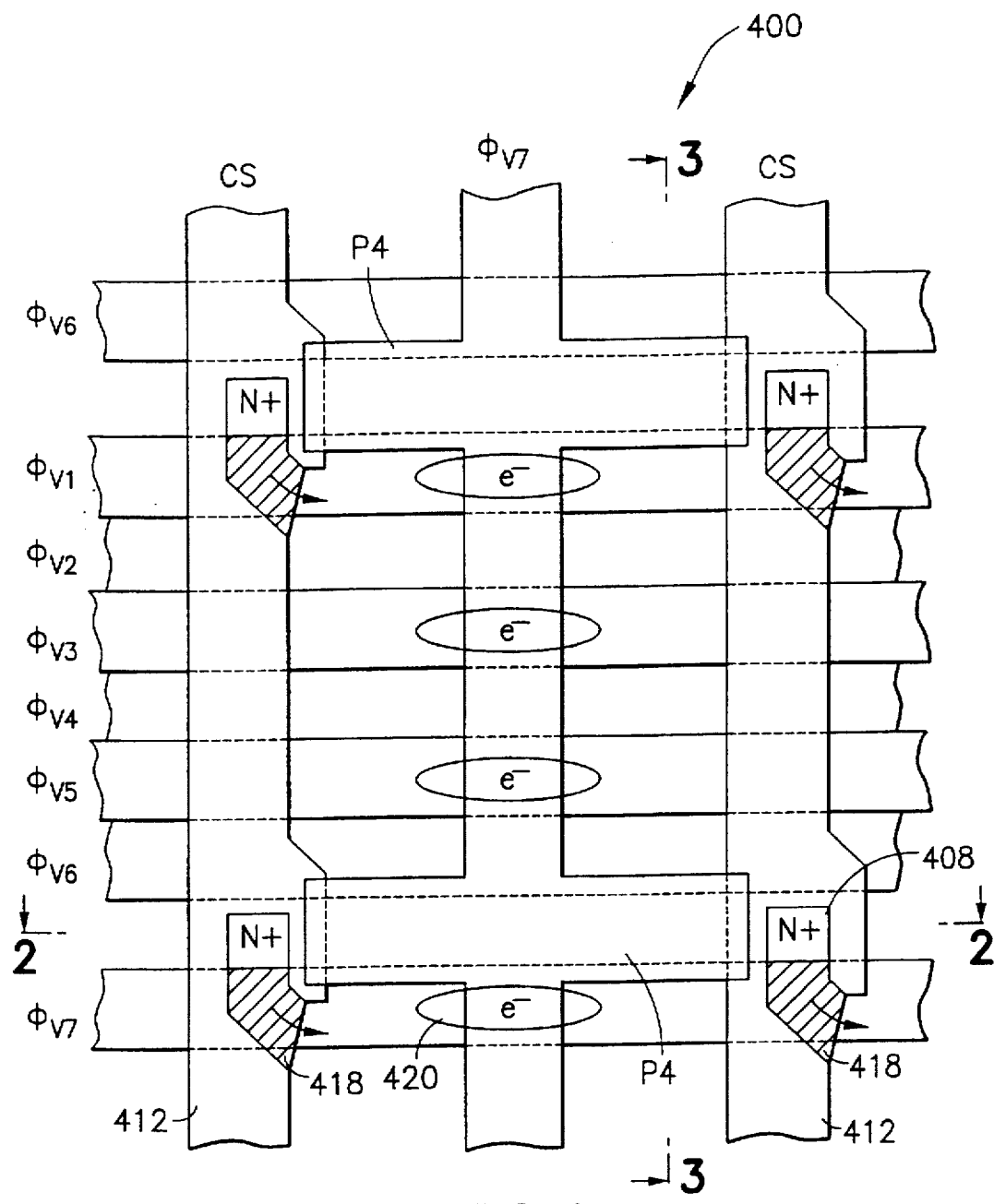
FIG. 1 is a plan view of a portion of a multi-frame CCD structure in accordance with the invention.

The present invention involves a CCD image sensor that is capable of capturing a-color image using rapid sequential exposures and of a two-story construction with an upper photosensitive layer that senses input image radiation and overlies a CCD structure, the function of which is to collect, store, and readout more than one charge packet per pixel, while keeping the pixel size minimized. The manner by which more than one charge packet may be collected per pixel in an area-efficient way is through the use of ripple-clocking, i.e., a gating system for 5-, 7-, or 9-phase ripple clocking having a gate arrangement facilitating the minimizing of pixel size.

The overlying photosensitive layer, or top story of the two stories, is preferably of amorphous silicon which is known to provide high quantum efficiency over the visible spectrum along with low dark current density. While at one time there were troublesome after-image problems with this material, such problems have recently been largely solved. In this preferred embodiment, the photosensitive layer can be photoconductive and have photoconductive gain and a blocking contact-can be used so that high electric fields can be achieved for multiplication gain and/or avalanche gain. A suitable construction for the upper photosensitive layer may be a state-of-the-art amorphous silicon structure such as that used in the "stack-CCD" reported by Toshiba at ISSCC93 in a paper by M. SASAKI ET AL., entitled, "A ⅔-inch 400 K Pixel sticking-free Stack CCD Image Sensor". This layer sequence consists of: an ITO (indium-tin-oxide) film electrode on the upper surface; a-SiC(p); a-Si(i); a-SiN(i); and a lower metal electrode that is connectable to an N+ source in the CCD structure. The metal electrode defines the area of a pixel of the sensor. A variety of materials and multi-layer structures can also be used for the photosensitive layer.

A two-story CCD image sensor can be thought of as operating very much like a conventional Interline CCD, i.e., the photoelement collects signal charge and periodically this charge is emptied into a well of the vertical CCD register. In a conventional CCD sensor the photoelement is typically a CCD-type of structure where there is a well and where the well can be emptied completely. However, the photoelement can also be a PN-junction photodiode where the N-region is heavily doped, i.e., an N+ region, and forms one side of a capacitive circuit element and where this capacitor is reset, at readout, to an initial voltage. This N+ region can be thought of as a floating source that gets recharged to an initial reverse bias, and which gets discharged by the photocurrent. In any N-channel, two-story device there is such a heavily doped N-region, and there is a contact between this region and the lower metal electrode that defines the pixel in the upper photosensitive layer. The upper ITO transparent electrode might typically be biased near the P-type substrate ground potential of the CCD so that for very bright imagery the potential of the N+ region becomes essentially zero.

The CCD gating system may have several gate electrode layers, that can be laid out in various ways. The pixel-defining electrode in a two-story device is generally a refractory metal and it is generally desirable to have as little lost space as possible between the electrodes. Therefore, because of the normal limitations of IC fabrication, it is preferred to construct all the CCD gates of poly-Silicon (also referred to as poly or poly-Si). This can readily be done with three layers of poly as will be described. Also, a two-story structure could be fabricated with less than three layers of poly using a known technique for making CCD gate layouts called the edge-etch method for making submicron cuts in one layer of poly-Si as described in the commonly-assigned U.S. Pat. No. 4,063,992, entitled "Edge Etch Method of Reproducing Narrow Openings to the Surface of Materials", issued to H. H. HOSACK in 1977. However, with four layers, the density can be improved, so that four layers of poly-Si are preferred for the gate array of the invention.

Figure 2:
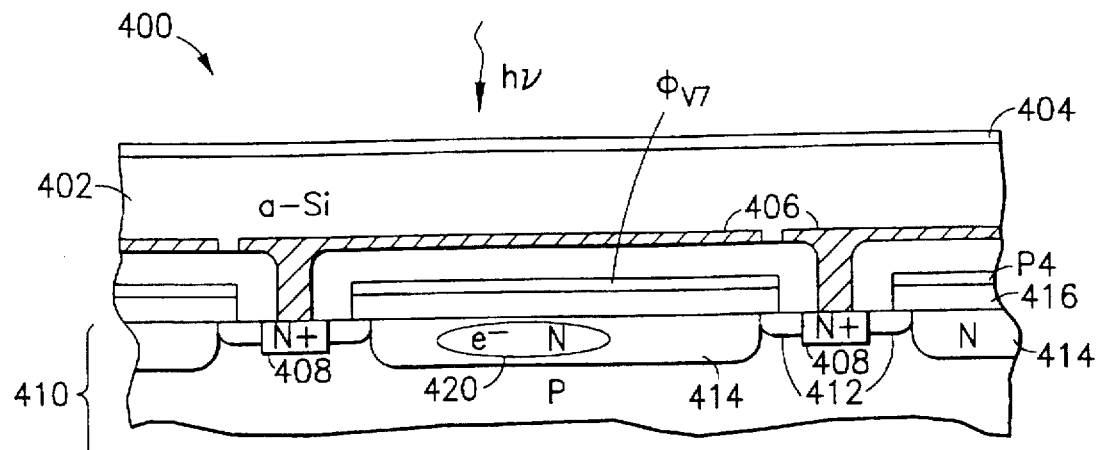
FIG. 2 is a view in cross-section of the CCD structure shown in FIG. 1 taken along the lines 2—2 therein.
Figure 3:
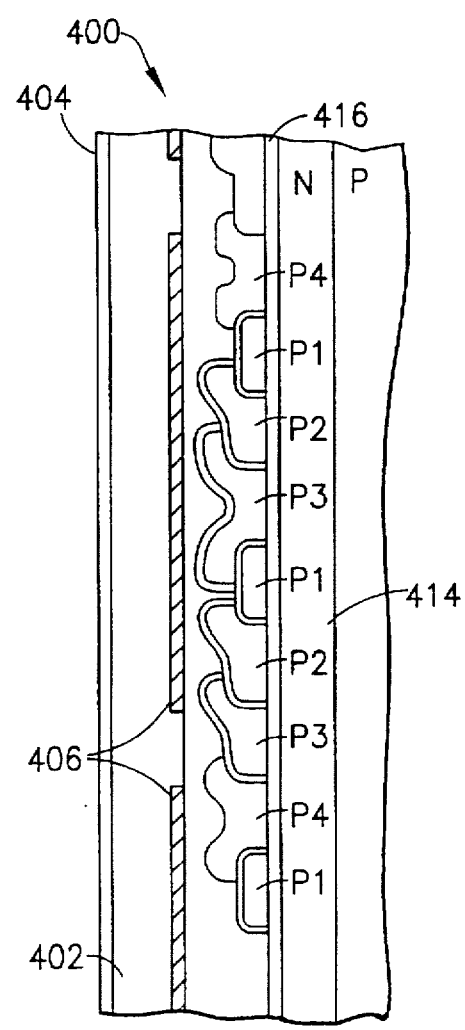
FIG. 3 is a view in cross-section of the CCD structure shown in FIG. 1 taken along the lines 3—3 therein.

Accordingly, a preferred embodiment of the present invention is illustrated in FIGS. 1–3 in the form of a two-story, 3-frame image sensor having vertical CCD registers of 4-poly, 7-phase-ripple, design. FIG. 1 is a plan view of a portion of a preferred embodiment of a multi-frame CCD structure in accordance with the invention. The structure shown makes up a device 400 which has a stacked or two story architecture in which there is an overlying layer of photosensitive material 402 shown in section in FIGS. 2 and 3. Layer 402 may typically comprise amorphous silicon (a-Si) as noted above, a material offering high quantum efficiency over the visible spectrum and low dark current density. A thin upper layer 404 is formed on layer 402, preferably of Indium-Tin-Oxide (ITO), which acts as a transparent electrode that in one embodiment is biased near the ground potential of P-type substrate 410 of the CCD so that the device does not bloom at high light levels. Lower electrodes 406 are in the shape of photosensitive imaging elements that are typically square or rectangular and correspond approximately to the pixel area for each unit cell. These lower electrodes can be made of a refractory metal. Electrodes 406 are connected to N+ diffusion regions 408 in the CCD substrate 410. These N+ regions can be patterned by self-alignment on all sides to poly. Regions 408 are formed within P-type channel stops 412 which define the boundaries of the vertical CCD registers of the underlying CCD array. The underlying CCD array comprises N-type buried channel regions 414, separated from each other by the P-type channel stops 412, and having gates $\phi_{v1}$–$\phi_{v7}$ of poly-Silicon disposed above them. The gates define storage regions in the vertical CCD registers and by imposed phased voltages control the potential profiles in these storage regions. Storage regions are shown in FIG. 1 under gates $\phi_{v1}$, $\phi_{v3}$, and $\phi_{v5}$ The storage areas should all be equal. The place where the channel narrows is preferably located at the edge of a gate. FIG. 3 particularly shows a 4-layer poly construction with gates $\phi_{v1}$, and $\phi_{v4}$ corresponding to the first layer, P1; gates $\phi_{v2}$ and $\phi_{v5}$ corresponding to the second layer, P2; gates $\phi_{v3}$ and $\phi_{v6}$ corresponding to the third layer, P3; and gates $\phi_{v7}$ corresponding to the fourth layer, P4. A gate dielectric layer 416 is disposed between the gate poly and the N-type buried channel regions 414. As seen in FIG. 1, the fourth poly layer, poly gates $\phi_{v7}$ runs vertically to provide a space between gates $\phi_{v6}$ and $\phi_{v1}$, and the channel stops 412 are irregularly shaped at these areas to form openings so that contact between electrodes 406 and N+ regions 408 may be made through these openings. The irregular shape of the channel stops 412 causes the channel itself to have an irregular shape. However, in keeping with the invention the channel area under each gate phase is to be the same, so that for a given pixel size, the saturation charge is maximized. Alternatively, a vertical refractory metal strap system might be employed to effect contact between the numerous individual $\phi_{v7}$ poly-Silicon gates, but the described arrangement is preferred.

Barrier regions 418, such as shown in FIG. 1, are provided between the N+ regions 408 and N-type regions 414 to prevent charge stored at regions 414 from spilling back into 408. The use of such a pixel barrier region is shown, for example, in commonly-owned U.S. Pat. No. 3,995,302, entitled "Transfer-Gateless Photosensor Configuration," issued to G. F. AMELIO in 1976. To prevent the pixel diode from recharging (and emptying) every time the CCD phase is pulsed HIGH, it is conventional to use a 3-level clock and only pulse the highest level when the diode is to be recharged. In the 7-phase ripple embodiment of the invention, only the one charge receiving phase has the 3-level clock. This architecture is quite desirable for a 3-frame, rapid-sequential device because it provides both a high quantum efficiency (QE) and a high fill factor.

In operation, when device 400 is ready for capturing an image, electrodes 406 are initially charged to a reference voltage of approximately 10 volts. Upon exposure to light (as shown in FIG. 2), photoexcitation occurs in photosensitive layer 402 thereby discharging the electrodes 406, and the respective N+ regions 408. Each N+ region 408 with its associated barrier region 418 and storage region 414 (under $\phi_{v1}$) may be modeled as a FET with region 408 representing a floating source electrode, region 418 representing the channel under the gate electrode $\phi_{v1}$, and region 414 under $\phi_{v1}$ representing the drain electrode. The voltage of region 408, determined by the level of photoexcitation in layer 402, ultimately determines the size-of a charge packet 420 in the region 414 under gate $\phi_{v1}$ via barrier region 418. Once the signal from one exposure is in the form of a charge packet in the CCD register, it is moved to another gate of the unit cell by a potential profile produced by a phased gate voltage, so that another charge packet can be generated in the region under gate $\phi_{v1}$ during the next exposure. Thus, through manipulation of the clocking of the poly gate potentials, charge packet 420 may then be moved along the channel of the vertical CCD register for storage in regions 414 under gates $\phi_{v3}$ and $\phi_{v5}$ (FIG. 1). During this moving process, successive charge packets may be formed in the region under gate $\phi_{v1}$ by subsequent image exposures. The embodiment shown preferably employs a 7-phase ripple clocking scheme such as described in detail in above-cited co-pending application Ser. No. 08/533,069, filed 25 Sep. 1995, the disclosure of which is incorporated herein by reference. Ripple clocking configurations generally can provide a smaller unit cell, for a given gate spacing, than other clocking schemes. The 7-phase ripple clocking scheme allows for the storage of three charge packets while using less space than would be required if 9 non-ripple phases were used. For example, a 9-phase embodiment requires 9 gates to handle three charge packets while with 7-phase ripple clocking only 7 gates are needed to handle the three charge packets. Nevertheless, it will be understood that other clocking schemes may be employed with this embodiment of the invention, if desired, such as a 9-phase ripple clocking scheme whereby four charge packets may be stored per pixel, or schemes for 5-phase ripple clocking or a 6-electrode non-ripple clocking as described below.

Referring again to FIG. 1, once charge packets 420 are moved from under $\phi_{v1}$ electrodes 406 are charged back to their original potential, and another exposure may occur. In this way, charge from three exposures may be collected without reading out the CCD array between exposures, and without the mixing of charge from different exposures. Once charge packets are stored for each exposure, each vertical CCD register may then be read out for processing of the image.

It will thus be seen that device 400 is formed with a number of charge-carrying regions 414 arranged in columns separated by channel stop columns 412, and containing a plurality of charge-packet storage regions disposed in spaced rows in the columns. The rows are defined by overlying gate electrodes and the storage regions consist of a first type of region for storing respective charge packets corresponding to the charge generated in adjacent portions of the photosensitive region, and second type regions, disposed in one or more rows in the columns between the rows containing the first type regions, for receiving charge packets transferred from the first type storage regions. A plurality of source regions 408 are respectively disposed in the channel stop columns 412 in rows next to the rows containing the first type storage regions and a plurality of barrier regions 418 are respectively disposed between the plurality of source regions 408 and the plurality of first type storage regions in the next rows, for forming diodes including a source region and a first storage region.

In order to minimize the dark signal of the device, and therefore minimize the noise level in the dark, it is desirable to design the device with MPP (multi-pinned phase) barriers. While there are various ways to do this, it is preferred to implant MPP barriers just before the Poly-3 deposition of the above 4-poly design without any unit cell special mask. FIG. 4 shows that barriers (N-) form under both the Poly-3 (P3) and the Poly-4 (P4) gates so as to define two barriers per pixel. This is entirely satisfactory for this image sensor since, during the exposures, which may each be longer than the trap emptying time (that is, of the order of magnitude of 50–100 μsec.), when it is desirable to have all the clocks (1–7) stationary and the surface potential under all the gates pinned, it is only necessary to store two charge packets per pixel. The third exposure signal can remain in the form of a voltage on the capacitance of the N+ node of the pixel circuit. After the end of the third and last exposure the voltage of the N+ node can be reset to its initial reference voltage one last time, forming the third charge packet per unit cell. Immediately thereafter the 3 charge packets per unit cell are read out in one ripple clock phase.

Figure 6:
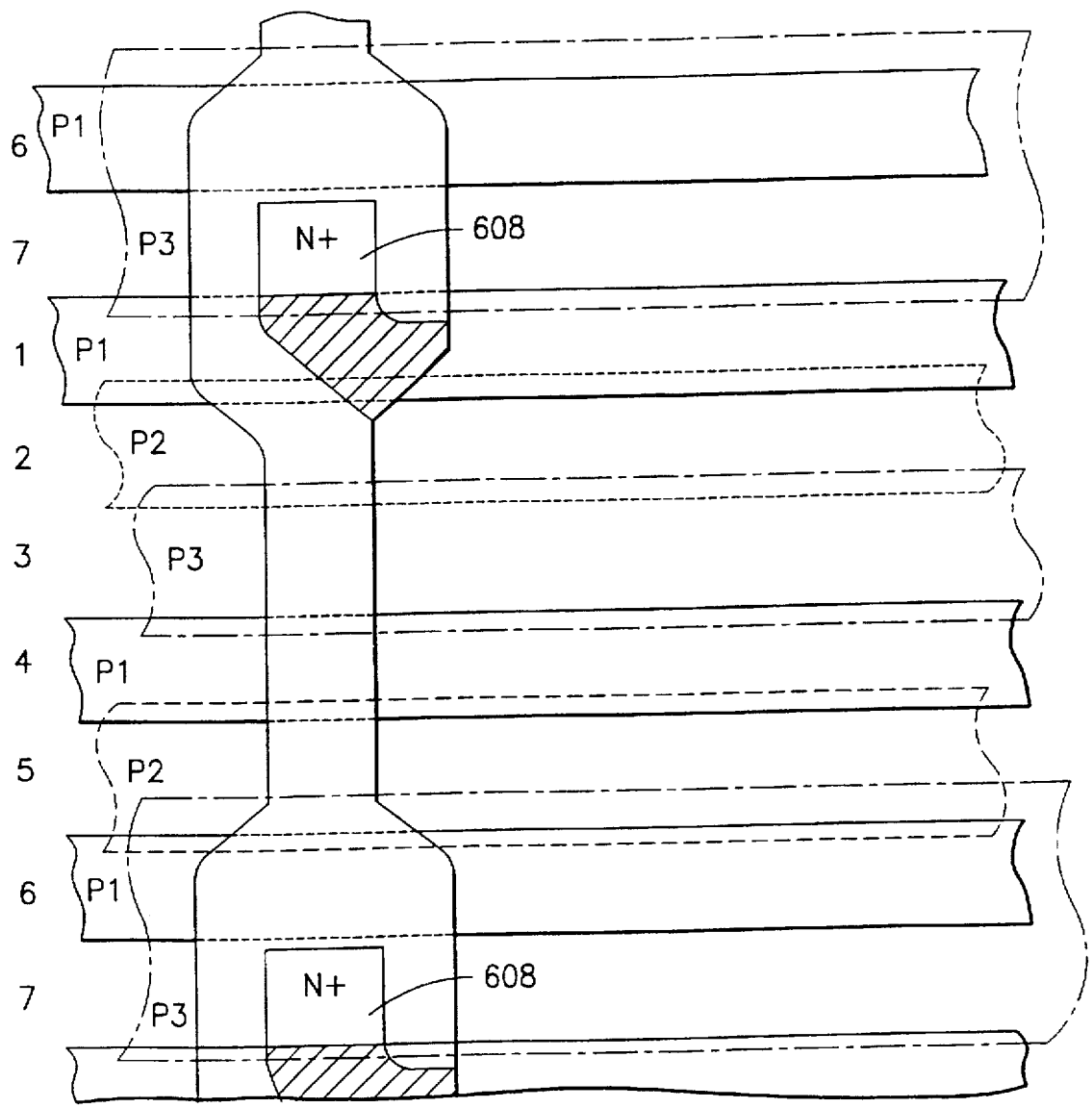
FIG. 6 is a plan view of a portion of a multi-frame CCD structure in accordance with the invention showing how the Poly-3 can be laid out around each N+ region in a 3-Poly design.

Another way to lay out the 7-phase ripple embodiment is to use three layers of polysilicon and wrap the Phase-7, Poly-3 stripe around the N+ region as shown in FIGS. 5 and 6. The cross-sectional view in FIG. 5 shows the sequence of phases (1–7) and layers (P1–P3), as well as showing the MPP barriers (N-) formed by implanting after Poly-2 (P2) and before Poly-3 (P3). FIG. 6 is a plan view at the N+ regions 608. The Phase-7, Poly-3 (P3) stripe in this design lies over all of the Phase-6, Poly-1 (P1) stripe and lies partially over the Phase-5, Poly-2 (P2) stripe. In this design the N+ region 608 is defined by the edges of Poly-1 (P1) and Poly-3 (P3) so as to provide a high density design.

5-phase-ripple designs

In another embodiment of the invention directed to achieving a very compact CCD, 5-phase-ripple designs are utilized. With the 5-phase ripple designs, three exposures are still taken in rapid sequence, but then in the readout period; the charge packets for the first two exposures are firstly read out together, and then the signal from the N+ nodes is transferred to the CCD registers and the whole array of CCD registers is read out once more. A 5-phase CCD can keep two charge packets per stage separate from each other provided it is read out in ripple fashion as will be understood from a consideration of the description in the above-cited co-pending application incorporated by reference.

6-electrode non-ripple designs

Since the conventional approach of a 3-exposure, rapid-sequential CCD image sensor requires three stages of 3-phase register for a total of nine electrodes per unit cell, and since the present invention deals with various ways to build a simpler and smaller unit cell, another embodiment of the invention is a two stage per unit cell, 3-phase CCD with an upper level photo-sensitive layer. This 6-electrode non-ripple design has the advantage that it is simpler to clock during readout so that under some conditions the device can be read out faster and can have less added noise imposed by the readout limitations of the system.

Antiblooming

The device can be prevented from blooming in high-light regions by proper choice of both the threshold voltage of the barrier 418 adjacent to the N+ region 408 and the voltage applied to the ITO electrode 404, as well as by taking conventional CCD design precautions, such that the voltage of the N+ will never go so low that charge can spill out during the exposure periods. However, after the exposure periods and before readout of the array it is advantageous to dither some or all of the vertical clocks so as to make certain that none of the charge packets are so large that (vertical) spilling could occur. This spilling is a type of blooming.

Figure 7:
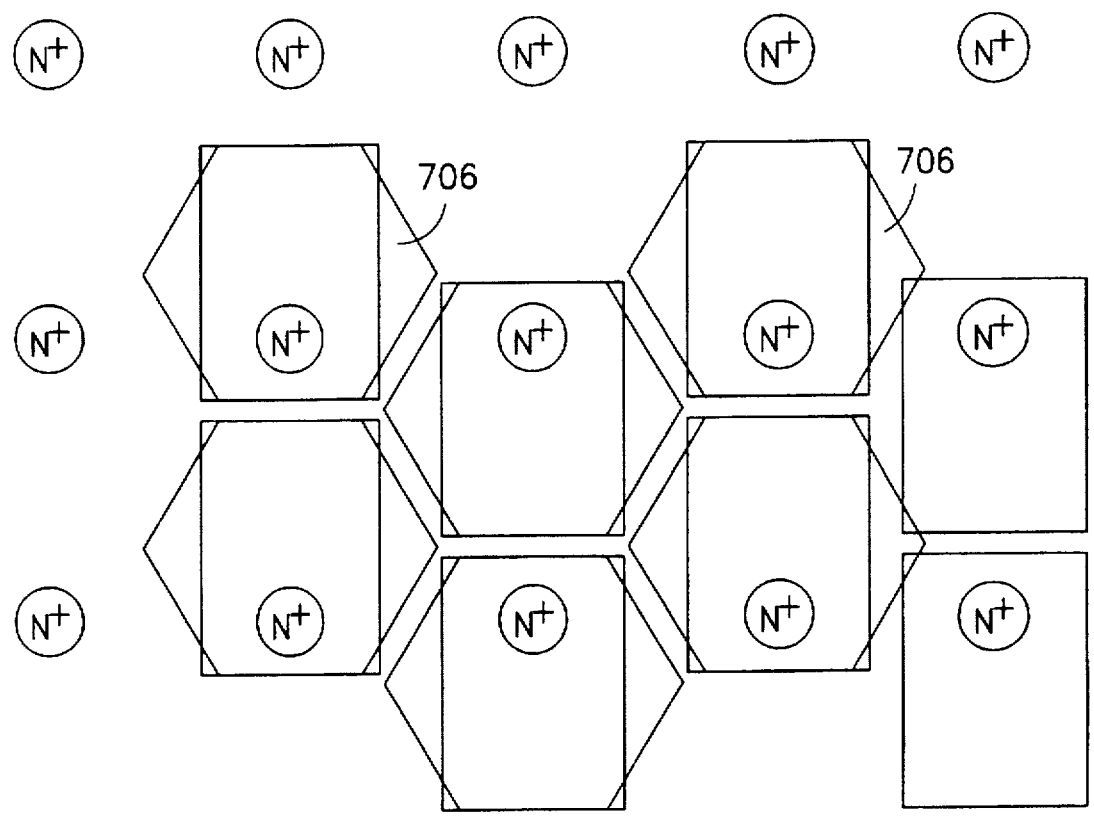
FIG. 7 is a plan view of a portion of a multi-frame CCD structure in accordance with a form of the invention wherein the pixel electrodes are hexagonally shaped.

The substrate structure 410 of the above-described embodiments may be either CCD or MOS. The photosensitive layer 402 can be photoconductive amorphous silicon and have photoconductive gain, as noted, and can also have a blocking contact or electrode so that high electric fields can be achieved in order to have multiplication gain and/or avalanche gain. Additionally, amorphous selenium structures have been developed for vidicons which are much thicker than normal integrated circuit films and work with high voltages, i.e., over 100 V, so that they can provide gains of the order of 10 to 100. The lower electrode 406, which defines the pixel area, may be of shapes other than square and rectangular, e.g., hexagonal such as the electrodes 706 shown in FIG. 7.

The invention may be applied in a 3-color sequential camera having a shutter that opens at the start of the imaging and closes at the end, and a rapidly changing set of color filters that operate during imaging. The color filters may be electro-optical, and the shuttering may be enabled by electro-optical means. Other contemplated applications include: a 3-frame CCD for motion study; a 3-frame CCD for capturing three unpredictable events; a 4-frame CCD for advanced color applications; and a 2-frame CCD for color applications, where the CCD has a color filter mosaic providing two colors and an electro-optical color switcher gives one or more new color combinations, e.g., yellow plus cyan produces green. With appropriate color shuttering considerable flexibility may be built into a camera containing a sensing device of the invention. For example, the camera can preview the color temperature of the illumination and adjust the relative exposure lengths of the three colors to give the best overall picture reproduction. Also, in a low light level scene, the blue exposure may be skipped or both the blue and the red exposures may be skipped to give the best possible picture reproduction which in such case would be black and white.

It will therefore be seen that a multiple-frame image sensor is disclosed that is capable of multiple short exposures without any time lost between them and the stored image indicative charge signals can be read out at a rate independent of the exposure times thus minimizing the readout noise if reading out is done quite slowly. In contrast to prior art periodic sequential mode approaches to imaging, the invention involves a one-shot rapid-sequential mode.

What is claimed is:

1. Apparatus for generating and storing charge in response to an incidence of electromagnetic energy, comprising:
   a photosensitive region for generating electrical charge in response to the incidence of electromagnetic energy;
   a transparent electrode layer overlying the photosensitive region;
   a charge-carrying region, disposed beneath and along said photosensitive region and arranged in columns and rows, with said columns separated by channel stop columns, said charge-carrying region comprising:

a plurality of first storage regions, disposed in spaced rows in said columns, for storing respective charge packets corresponding to the charge generated in adjacent portions of said photosensitive region;

a plurality of second storage regions, disposed in rows between said spaced rows in said columns, for receiving charge packets stored in said first storage regions;

a plurality of source regions, respectively disposed in said channel stop columns in rows next to the rows containing said first storage regions;

a plurality of barrier regions, respectively disposed between said plurality of source regions and said plurality of first storage regions in the next rows, for forming diodes including a source region and a first storage region;

a plurality of pixel electrodes, disposed between said photosensitive region and said charge-carrying region and each contacting said photosensitive region and connected to one of said plurality of source regions, for respectively coupling each first storage region to the corresponding adjacent portion of said photosensitive region to produce a charge packet in each first storage region corresponding to the charge in said corresponding adjacent portion of said photosensitive region;

a plurality of sets of gate electrodes, disposed between said plurality of pixel electrodes and said charge-carrying region, with each electrode set having one electrode with a portion in a row containing a source region and a portion in a column adjacent said second storage regions, and having the other electrodes respectively in rows adjacent the rows of second storage regions, for coupling a phased voltage to said first and second storage regions; and a source of a plurality of independently controllable clock voltage phases coupled to said gate electrodes for controlling the potential profiles of said first and second storage regions to move a number of charge packets successively formed in said first storage regions along the columns of rows of said second storage regions for storage therein until read-out of said number of charge packets.

2. Apparatus as in claim 1 wherein each set of gate electrodes comprises seven gate electrodes and wherein said one gate electrode is the seventh electrode of the set and leaves an opening between the first and sixth electrodes in each set above said source regions.

3. Apparatus as in claim 1 wherein said charge-carrying regions comprise N-type channel regions disposed in a P-type substrate.

4. Apparatus as in claim 3 wherein said transparent electrode layer is biased near the potential of said P-type substrate.

5. Apparatus as in claim 3 wherein said source regions comprise N+ regions.

6. Apparatus as in claim 1 wherein the number of clock voltage phases is seven, the clock voltage phases being coupled to the gate electrodes in a repeating seven phase pattern which is operable to store three separate charge packets.

7. Apparatus as in claim 1 wherein the number of clock voltage phases is nine, the clock voltage phases being coupled to the gate electrodes in a repeating nine phase pattern which is operable to store four separate charge packets.

8. Apparatus for generating and storing charge in response to an incidence of electromagnetic energy, comprising:

a photosensitive region for generating electrical charge in response to the incidence of electromagnetic energy;

a transparent electrode layer overlying the photosensitive region;

a charge-carrying region, disposed beneath and along said photosensitive region and arranged in columns and rows, with said columns separated by channel stop columns, said charge-carrying region comprising:

a plurality of first storage regions, disposed in spaced rows in said columns, for storing respective charge packets corresponding to the charge generated in adjacent portions of said photosensitive region;

a plurality of second storage regions, disposed in rows between said spaced rows in said columns, for receiving charge packets stored in said first storage regions;

a plurality of source regions, respectively disposed in said channel stop columns in rows next to the rows containing said first storage regions, each of said source regions having a barrier region disposed between it and the first storage region in the next row for forming diodes including a source region and a first storage region;

a plurality of pixel electrodes, disposed between said photosensitive region and said charge-carrying region and each contacting said photosensitive region and connected to one of said plurality of source regions, for respectively coupling each first storage region to the corresponding adjacent portion of said photosensitive region to produce a charge packet in each first storage region corresponding to the charge in said corresponding adjacent portion of said photosensitive region;

a plurality of sets of gate electrodes, disposed between said plurality of pixel electrodes and said charge-carrying region, for coupling a phased voltage to said first and second storage regions, each electrode set comprising seven electrodes; and a source of 7-phase ripple-clocked independently controllable voltage phases coupled to said sets of gate electrodes for controlling the potential profiles of said first and second storage regions to move two charge packets successively formed in said first storage regions along the columns of rows of said second storage regions for storage therein until readout of said two charge packets with third charge packets stored in said first storage regions.

9. Apparatus as in claim 8 wherein each electrode set of said plurality of sets of gate electrodes, has one electrode with a portion in a row containing a source region and a portion in a column adjacent said second storage regions, and has the other electrodes respectively in rows adjacent the rows of second storage regions.

10. A method for fabricating a device for generating and storing charge in response to an incidence of electromagnetic energy, the method comprising the steps of:

providing a substrate;

forming columns containing first storage regions in the substrate;

forming second storage regions in the substrate, in rows between said first storage regions;

forming channel stop columns in said substrate, separating said columns containing rows of said first and second storage regions;

forming source regions in said channel stop columns in rows next to the rows containing first storage regions;

forming barrier regions in the substrate between said source regions and said first storage regions in the next rows to form diodes by which a charge packet may be formed in each first storage region corresponding to a potential in the corresponding first source region;

forming gate electrodes over said first and second storage regions, with a dielectric layer in between, for controlling the potential profiles of said first and second storage regions;

forming pixel electrodes over said gate electrodes, each pixel electrode being coupled to one of said source regions through openings in said gate electrodes;

forming a photosensitive layer over and in contact with said pixel electrodes; and forming a transparent electrode layer over the photosensitive layer.

11. The method of claim 10 wherein said gate electrodes comprise sets of seven electrodes and comprising the further step of coupling said gate electrodes to a source of a 7-phase ripple clock voltage.

12. The method of claim 10 wherein said gate electrodes are formed in sets of electrodes with each electrode set having one electrode with a portion in a row containing a source region and a portion in a column adjacent said second storage regions, and having the other electrodes respectively in rows adjacent the rows of second storage regions.

13. The method of claim 10 comprising the further step of coupling said transparent electrode layer to said substrate.

14. The method of claim 10 wherein said substrate is of semiconductor material of a first conductivity type, said columns are formed of buried channel regions and, with said first and second storage regions, comprise CCD registers of unit cells.

15. A CCD structure for sensing incident electromagnetic image radiation and formed of arrays of unit cells with a capacity of N charge packets, where N is two or greater, each unit cell comprising:

a single CCD channel;

a photoconductive element overlying said CCD channel and producing image indicative charge therein in response to incident electromagnetic image radiation;

a grounded transparent upper electrode contacting said photoconductive element;

a lower electrode contacting said photoconductive element and disposed between said photoconductive element and said CCD channel and having a voltage imposed thereon;

a source electrode connected to said lower electrode and adjacent said CCD channel, for producing a charge packet in said CCD channel upon the discharge of the voltage on said lower electrode by the image indicative charge in said photoconductive element; and gate means, disposed between said lower electrode and said CCD channel, for defining storage regions for said charge packets in said CCD channel when phased voltages are imposed thereon to control the potential profiles in the storage regions;

and wherein, said unit cells are arranged in arrays of columns and rows that can be operated as a rapid-sequence electromagnetic image sensing device by using phased voltages on said gate means to control the storage of charge packets in N storage regions in response to N+1 electromagnetic image exposures.

16. A structure as in claim 15 wherein N=3.

17. A structure as in claim 15 wherein said photoconductive element is of amorphous silicon and comprises blocking electrodes.

18. A structure as in claim 15 wherein said photoconductive element is of amorphous selenium and comprises blocking electrodes.

19. A structure as in claim 15 wherein said said source electrode is an N+ diffusion and further comprising P-type channel stops bounding said source electrode on at least two sides.

20. A structure as in claim 15 wherein said grounded transparent upper electrode comprises ITO and said lower electrode comprises refractory metal.

21. A structure as in claim 15 wherein said lower electrode comprises an hexagonal element.

22. A structure as in claim 15 further comprising ripple-clock means coupled to said gate means for producing said phased voltages thereon.

23. A structure as in claim 22 further comprising means for dithering said phased voltages produced on said gate means.

24. A structure as in claim 15 wherein said gate means further comprises MPP barriers.

* * * * *